US006494997B1

(12) United States Patent
Israel et al.

(10) Patent No.: US 6,494,997 B1
(45) Date of Patent: Dec. 17, 2002

(54) RADIO FREQUENCY MAGNETRON SPUTTERING FOR LIGHTING APPLICATIONS

(75) Inventors: Rajasingh Israel, Westlake; Tianji Zhao, Mayfield Heights; Rolf Sverre Bergman, Cleveland Heights; Kenneth Marsik, Parma, all of OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/641,308

(22) Filed: Aug. 18, 2000

(51) Int. Cl.[7] .............................................. C23C 14/35
(52) U.S. Cl. ........................... 204/192.12; 204/298.15; 204/298.17; 204/298.26; 204/298.27; 204/298.28
(58) Field of Search ....................... 204/192.12, 192.15, 204/298.13, 298.06, 298.15, 298.17, 298.28, 298.27, 298.26

(56) References Cited

U.S. PATENT DOCUMENTS 5,690,796 A * 11/1997 DuPont et al. ......... 204/192.16
5,985,115 A * 11/1999 Hartsough et al. ..... 204/298.09
6,103,320 A * 8/2000 Matsumoto et al. ........ 427/535

* cited by examiner

Primary Examiner—Steven H. VerSteeg
(74) Attorney, Agent, or Firm—Fay, Sharpe, Fagan, Minnich & McKee, LLP

(57) ABSTRACT

A magnetron sputtering device and method for applying an interference layer to a substrate includes a magnetron sputtering chamber (A) which houses a substrate carrying assembly (B). The substrate carrying assembly comprises a primary rotation table (10), rotating about its central vertical axis (12) and at least one secondary table (36) mounted to an upper surface (14) of the primary rotation table. Substrates (42) are either horizontally or vertically loaded on to the secondary table. The substrates rotate about their symmetrical axis. First and second targets (50a, 50b) are housed by the chamber and are disposed on opposite sides of the chamber. The primary rotation table rotates the substrates between a position adjacent a first target where a layer having a low refractive index is applied to the substrates and a position adjacent a second target where a layer having a high refractive index is applied to the substrates.

30 Claims, 8 Drawing Sheets

RADIO FREQUENCY MAGNETRON SPUTTERING FOR LIGHTING APPLICATIONS

BACKGROUND OF THE INVENTION

1. Field of the Invention

The present invention pertains to an apparatus and method for improving the performance of coating devices adapted, particularly a coating device that applies a multi-layer film to an envelope of a light source. More particularly, the present invention relates to a radio frequency (RF) magnetron sputtering device and method which is capable of depositing a relatively thick film having a low film stress onto an envelope thereby increasing lumen gain.

2. Discussion of the Art

Thin film optical coatings, also known as interference filters, comprise alternating layers of two or more materials of different indices of refraction. Such coatings or films are well known and used to selectively reflect or transmit light radiation from various portions of the electromagnetic radiation spectrum, such as ultraviolet, visible and infrared radiation. The thin film optical coatings are used in the lamp industry to coat reflectors and lamp envelopes. One application in which the thin film optical coatings are useful is to improve the illumination efficiency, or efficacy, of lamps by reflecting infrared energy emitted by a filament, or arc, toward the filament or arc while transmitting visible light of the electromagnetic spectrum emitted by the light source. This decreases the amount of electrical energy required to be supplied to the light source to maintain its operating temperature.

The film generally comprises two different types of alternating layers, one having a low refractive index and the other having a high refractive index. $SiO_2$ is a commonly used low index material while $TiO_2$, $Ta_2O_2$, $Nb_2O_5$, $ZrO_2$, and $HfO_2$ are excellent candidates for the high refractive index material. With these two materials, an optical thin film filter, which is deposited on the outer surface of the lamp envelope, can be designed. The filter transmits the light in the visible spectrum region (3800 to 7800 angstroms) emitted from the light source while it reflects the infrared light (7800 to 25000 angstroms). The returned infrared light heats the light source during lamp operation and, as a result, the lumen output of a coated lamp is considerably greater than the lumen output of an uncoated lamp.

Known methods for applying interference filters or coatings to a light source include low pressure chemical vapor deposition (LPCVD) and sputtering techniques. While capable of producing a satisfactory interference filter for light sources, such techniques have limitations with respect to the uniformity of the coating, layer thickness, and packing density.

In a conventional LPCVD process, two reactive gases are introduced into a vacuum chamber where they chemically react to form a thin film over a substrate, such as a quartz or glass envelope. This process can be repeated several times to apply multiple layers on the substrate. It is well known in the art of coating light source envelopes that the greater the film stack or number of layers comprising the interference filter, the greater the lumen gain. However, the thickness limit for a lamp interference layer produced by LPCVD is approximately four micrometers (about 40 layers).

Interference filters greater than about four micrometers or 40 layers cannot be prepared for light sources by the process of LPCVD because the intrinsic stress in such a thick layer of film is too large. Relatively thick films will crack during thermal cycling, thereby forming a crack network across the lamp, that for thick films usually tears the quartz substrate and could lead to lamp failure. Even if the film cracking does not rupture, the cracked film surface has high scatter loss which reduces the application of the lamp. For these reasons, the thickness of lamp interference filters prepared by LPCVD is limited to a thickness of about four micrometers or 40 layers. The corresponding lumen gain (gain over uncoated lamp) for such a thickness is only about 38%. It is an object of the present invention to achieve significantly higher lumen gains.

As mentioned, sputtering techniques are also used to coat light sources. A typical sputtering device includes a chamber housing at least one target and a substrate. A gas, such as argon, is introduced into the chamber which becomes positively ionized. The positive argon ions bombard the target causing deposition material to be removed and condense into a thin film on the substrate. Sputtering techniques suffer from a number of shortcomings when used to prepare interference filters for light sources.

First, light sources are typically designed having elliptical envelope shapes. Thus, the target atoms sputtered from the target deposit on the lamp surface from different incident angles. As a result, the film deposited on the lamp surface is not uniform which negatively effects lumen output. Second, it is difficult to couple RF power to a quartz or glass lamp due to the low impedance of the lamp. By coupling RF power to the light source, one can produce a substrate bias which results in a denser, better performing film. Third, the high refractive index layer is often made from titanium dioxide ($TiO_2$), which at temperatures of about 800 to 900° C. changes to a crystal phase. Such a form of $TiO_2$ is undesirable.

Thus, a need exists to provide a coating technique which overcomes the foregoing problems associated with LPCVD and known sputtering techniques.

BRIEF SUMMARY OF THE INVENTION

A new and improved apparatus and method is provided for coating light sources which meets the foregoing needs.

In an exemplary embodiment a radio frequency (RF) magnetron sputtering device for lighting applications includes a magnetron sputtering chamber. First and second targets are housed by the chamber and are disposed on opposite sides of the chamber. The first target is made from a material having a relatively low refractive index and the second target is made from a material having a relatively high refractive index. Also enclosed by the chamber is a substrate carrying assembly. The substrate carrying assembly is adapted to carry a series of substrates back and forth between a position adjacent the first target where the substrate is coated with the material having the relatively low refractive index and a position adjacent the second target where the substrate is coated with the material having the relatively high refractive index.

The first and second targets are preferably disposed vertically within the sputtering chamber so that a symmetrical axis of each of the substrates lies in a horizontal plane.

An exemplary method for applying an interference layer to light sources using a magnetron sputtering technique includes the steps of providing first and second targets within a magnetron sputtering chamber on opposite sides of the sputtering chamber; providing a substrate carrying assembly within the sputtering chamber between the first and second targets; mounting a series of substrates to the substrate carrying assembly; and selectively bombarding the first and second targets with a plurality of positively charged ions so that a plurality of atoms sputter off the first and second targets and deposit on a surface of the substrates.

One advantage of the present invention is the provision of a coating device and coating method for lighting applications capable of applying relatively thick films having a low film stress to substrates.

Another advantage of the present invention is the provision of a coating device and coating method for lighting applications which reduces film scatter while increasing lumen gain.

Another advantage of the present invention is the provision of a coating device and coating method for lighting applications having enhanced variation control and environmental protection.

Another advantage of the present invention is the provision of a coating device and coating method for lighting applications capable of coupling a radio frequency power source to a series of light sources via cooper shots.

Another advantage of the present invention is the provision of a film layer having a high refractive index which does not experience phase changes at elevated temperatures.

Still another advantage of the present invention is the provision of a coating device and coating method for lighting applications capable of applying a uniform film having a thickness error less than 10% across the surface of a substrate.

Still another advantage of the present invention is the provision of a coating device and coating method for lighting applications capable of applying a film having relatively low absorption properties.

Yet another advantage of the present invention is the provision of a coating device and coating method for lighting applications capable of applying a dense film across the surface of a substrate.

DETAILED DESCRIPTION OF THE INVENTION

Figure 1:
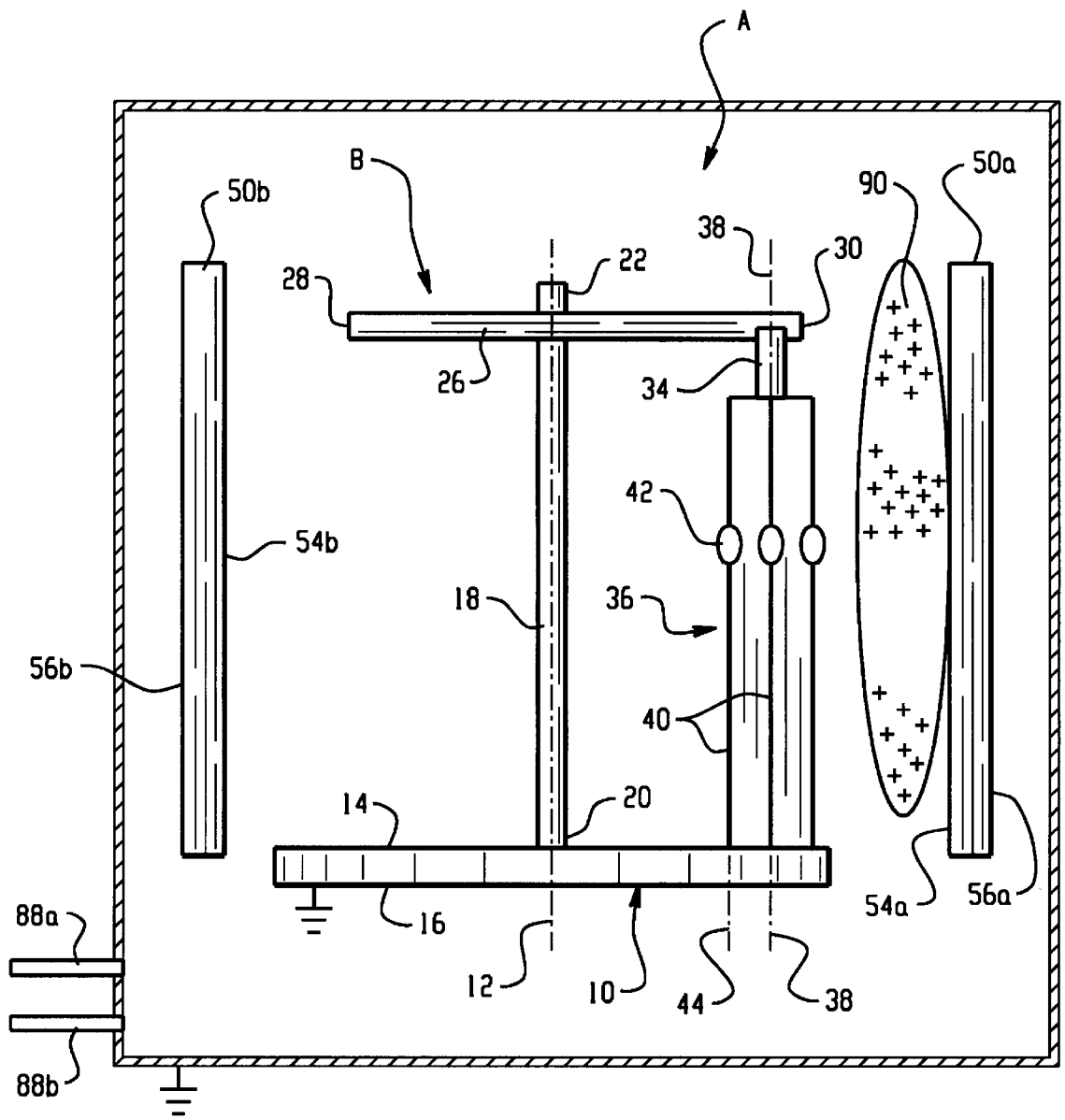
FIG. 1 is a front view of a magnetron sputtering device in accordance with a preferred embodiment of the present invention.

With reference to FIG. 1, a radio frequency (RF) magnetron sputtering chamber A is shown in accordance with the present invention. The chamber houses a substrate carrying assembly B for carrying substrates such as light sources. The substrate carrying assembly preferably includes a substantially circular primary rotation table 10 which lies in a horizontal plane and is adapted to rotate about its central vertical axis 12. The primary rotation table has an upper surface 14 and a lower surface 16, both of which are generally planar. An elongated member 18, such as an axle, having a first lower axial end 20 and a second upper axial end 22 extends vertically upward from the upper surface of the primary rotation table. An arm 26 having a first end 28 and a second end 30 is operatively connected at an intermediate portion to the elongated member. The arm 26 is disposed in a horizontal plane parallel to the primary rotation table.

Figure 2:
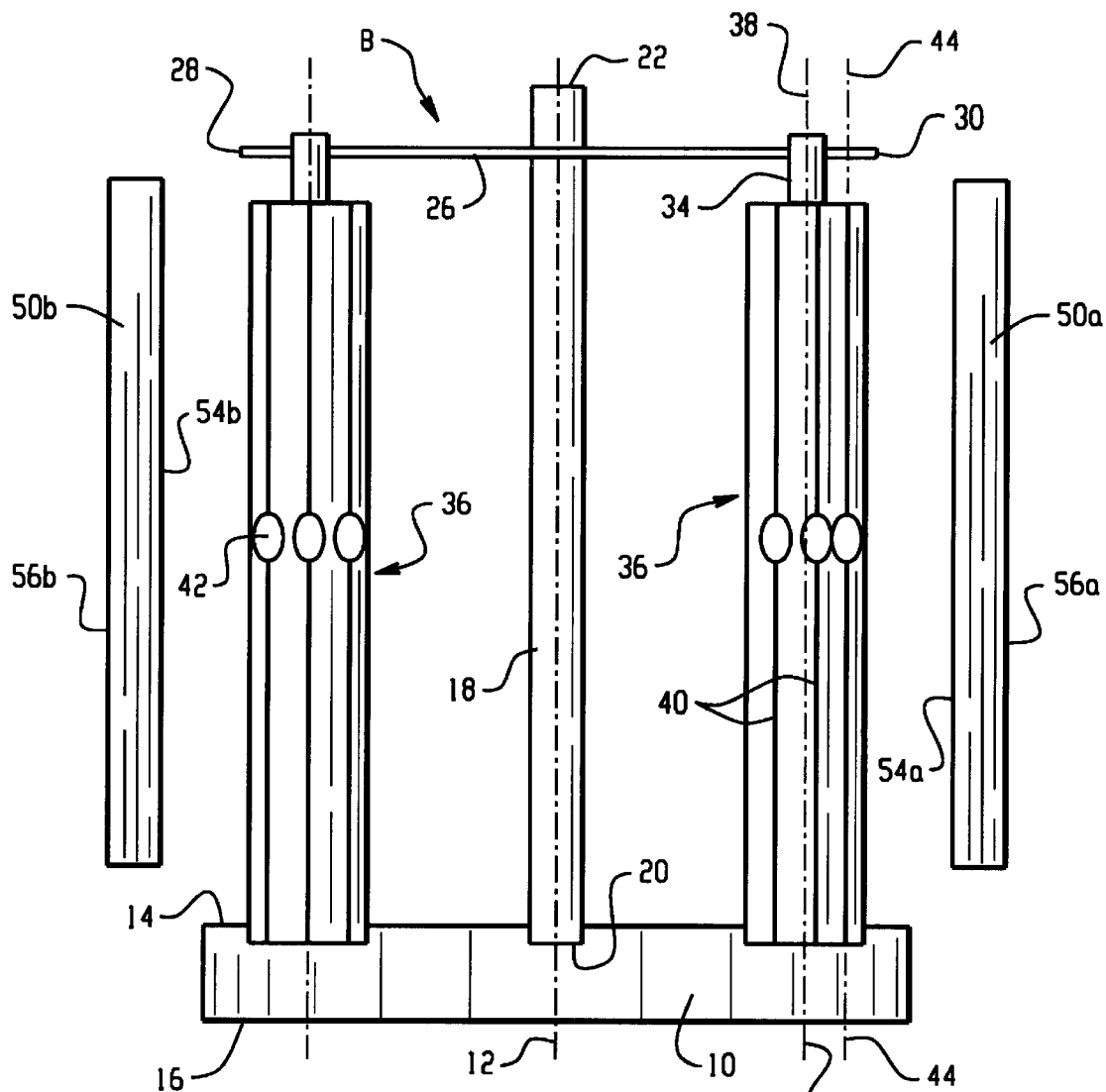
FIG. 2 is a front view of a magnetron sputtering device in accordance with another preferred embodiment of the present invention.

A connecting member 34 extends vertically downward from the arm 26 adjacent the second end 30. In the illustrated embodiment, the substrate carrying assembly also includes a secondary rotation surface or table 36 which is vertically and rotatably mounted between member 34 and the upper surface 14 of the primary rotation table. For purposes of this discussion, only one secondary rotation table has been shown and only one secondary table will be discussed. However, it must be appreciated that several secondary tables are preferred in order to maximize the production of the system. When more than one secondary table is used, several arms are provided having a secondary table extending from each of its opposing first and second ends (see FIG. 2). Alternatively, a substantially planar circular member may be provided in place of the arms, wherein the secondary tables extend downwardly from spaced locations along the periphery of the circular member.

With continued reference to FIG. 1, the secondary table 36 is adapted to rotate about a vertical axis 38 extending through the center of connecting member 34. The secondary table includes a series of lamp supports 40 which are vertically disposed and radially spaced from vertical axis 38. Each lamp support has a portion which extends radially outward from member 34 before bending ninety degrees (90°) and extending vertically downward. The lower end of each lamp support is operatively associated with the upper surface 14 of the primary rotation table.

Each lamp support carries a plurality of substrates 42, preferably light sources such as double ended quartz (DEQ) lamp envelopes. For ease of illustration only one DEQ lamp has been shown mounted to each lamp support. The DEQ lamps are vertically loaded on the lamp supports and are adapted to rotate about their central vertical axis 44. Thus, the DEQ lamps simultaneously rotate about three different axes which include axis 12, axis 38 and axis 44.

First and second targets 50a, 50b (referred to generally as 50), each having a front surface 54a, 54b and a rear surface 56a, 56b, are spaced opposite one another with their front surfaces disposed in facing relation. The first target produces a coating having a low refractive index while the second target produces a coating having a high refractive index. The first target preferably comprises a silicon material, however, other conventional materials having a low refractive index are within the scope and intent of the present invention. The second target may comprise any of a number of materials capable of producing a high index coating, such as titanium, tantalum, niobium, or zirconium.

Figure 3:
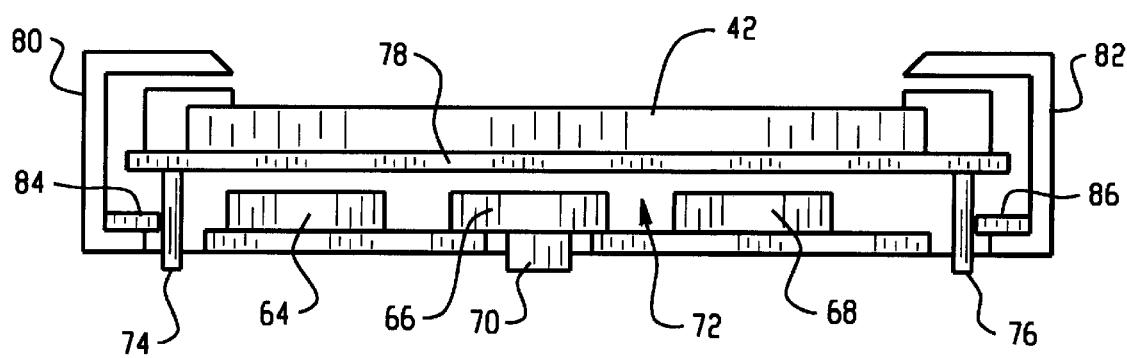
FIG. 3 is a top view of a magnetron sputtering target and its associated components in accordance with the present invention.

With continued reference to FIG. 1 and further reference to FIG. 3, first, second and third magnets 64, 66, 68 are located behind the rear surface of each target. The second or center magnet 66 is a north pole, for example, while the first and third outer magnets 64, 68 are south poles. The magnetic field created by the oppositely polarized magnets holds a plurality of electrons in front of the associated target by Lorentz force. The cathode power 70 is operatively connected to target 50 through backing plate 78. The RF has a frequency of approximately 13.65 MHZ. Preferably, the RF power source is also coupled to the substrates 42.

Since the targets become relatively hot during sputtering operations, a water channel 72 faces the backing plate to which the rear surface of each target has a tight contact by mechanical means for cooling purposes. The water channel includes an inlet 74, an outlet 76, and the backing plate. The water system is especially important for the silicon target 50a because silicon is a poor heat conductor. Grounded shields 80, 82 are disposed on both sides of the target and partially enclose the target, the water channel and the magnets. A first insulator 84 is located adjacent inlet 74 and a second insulator 86 is located adjacent outlet 76.

A shutter (not shown) is disposed in front of each target and is selectively adjustable between open and closed positions. When sputtering is taking place at one target, the associated shutter is open allowing sputtering to be performed. At the same time, the shutter associated with the non-working target is closed thereby protecting it from contamination.

In operation, the magnetron sputtering device deposits a film, comprising alternating layers of high and low refractive materials, to the surface of the substrate. Consider first the deposition of the low refractive layer. At least two gases, preferably argon 88a and oxygen 88b, are introduced into the magnetron sputtering chamber. The high potentials created by the cathode power source generate a plurality of positively charged argon ions which form an argon plasma 90. The positively charged argon ions are attracted to the silicon target 50a because the silicon target has a high negative potential. When the high energy ions reach the target, they strike the target thereby knocking silicon atoms off. The sputtered silicon atoms then deposit on the surface of the substrate. Oxygen, which is introduced into the chamber in either its atomic or ionic form, reacts with the deposited silicon, thus forming a thin film of $SiO_2$ having a low refractive index.

By providing a secondary table 36 which rotates about axis 38 during sputtering operations, all of the substrates 42 have substantially equal exposure to the sputtering target. If the secondary table did not rotate, then the substrates further from the target would not be coated to the same degree as the substrates closer to the target. In addition, by individually rotating the substrates, a more uniform coating is applied over the entire surface of each substrate. Otherwise, surfaces facing the target on a non-rotating substrate would naturally be thicker than surfaces not facing the substrate.

When the first target 50a has completed coating the substrates 42, one of the shutters (not shown) closes the first target while the other shutter (not shown) opens the second target 50b. The primary rotation table carries the substrates to the second target where the deposition of a high refractive index film, such as titanium dioxide, takes place. Sputtering at the second target operates in the same manner as sputtering at the first target. Positively charged ions strike the second target and knock off deposition material which sputters toward the substrates. The sputtering deposition material reacts with oxygen to form a thin layer of high refractive index film on the substrate.

Once the substrates 42 have been adequately coated at the second target, the primary rotation table advances the substrates to the first target where the coating cycle starts over. This cycle is repeated until the desired number of layers are applied. Preferably, 50–90 layers (about 4–9 micrometers in thickness) are applied to the light sources which results in at least a 50% increase in lumen gain. This is significantly greater than the 38% lumen gains which is approximately the maximum lumen gain that can be obtained using LPCVD processing.

As noted above, the RF power source is preferably coupled to the substrate 42. This creates a bias between the plasma 90 and the substrate. A bias is advantageous because it accelerates some of the ions from the nearby plasma causing them to bombard the condensed target atoms, thereby filling the voids which arise from the so-called columnar thin film structure. By filling the voids, a denser film is achieved, the oxides such as $SiO_2$ and $TiO_2$ have a better chemical composition in terms of stoichiometry, and a better interface is provided across the thickness of the film. Moreover, the coupled power elevates the temperature of the substrate which increases the mobility of the condensed atoms. This, too, results in the aforementioned advantages.

Figure 4:
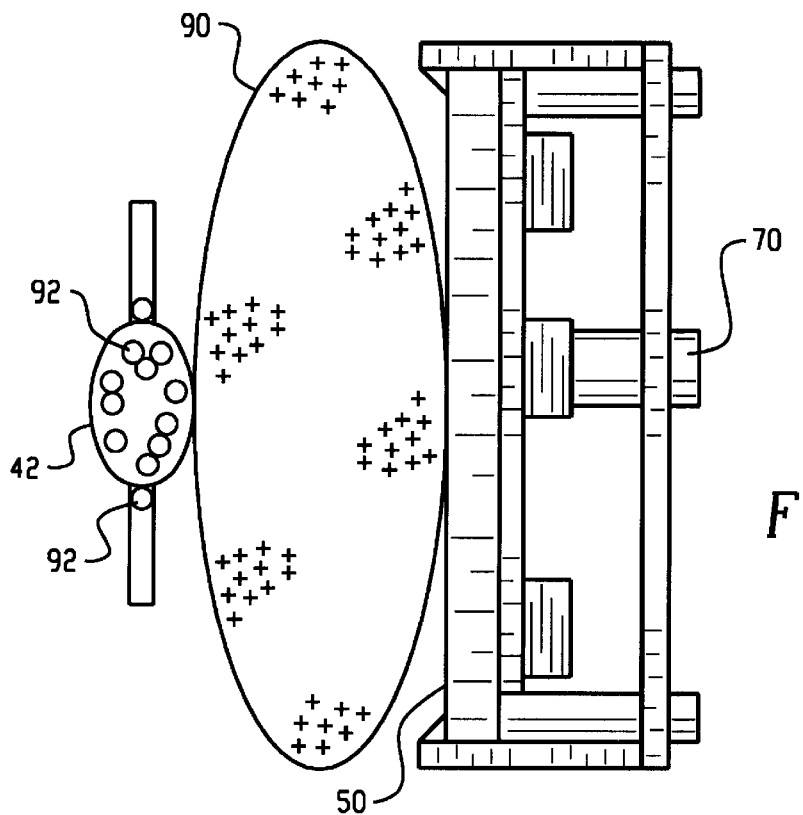
FIG. 4 is a top view of a substrate coupled to a radio frequency power source via cooper shots in accordance with the present invention.
Figure 5:
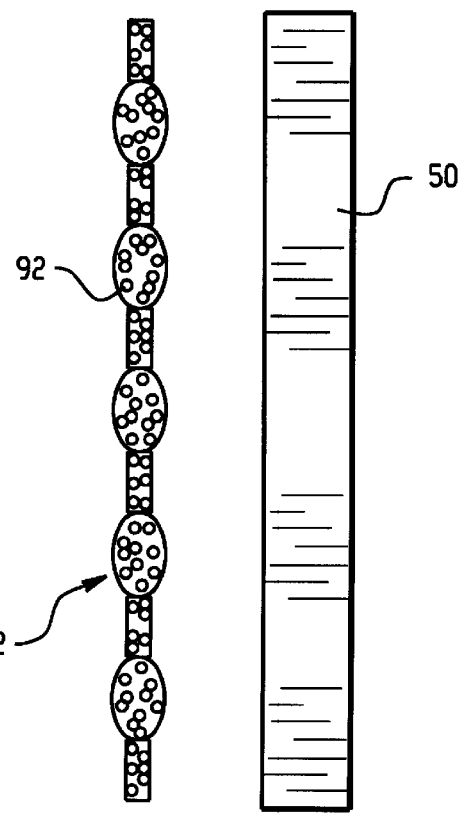
FIG. 5 is a front view of target located adjacent a plurality of substrates filled with cooper shots.

However, DEQ lamps 42 are typically made of quartz or glass which are insulating materials. Thus, coupling the RF power to such substrates results in a weak bias. In order to increase the bias between the substrates and the plasma 90, a plurality of cooper shots 92 (see FIGS. 4 and 5), preferably having a diameter of about 0.2–0.3 millimeters, are placed inside the substrates. The cooper shots are excellent conductive materials which can be effectively coupled to the RF power source. Acting as an impedance, the cooper shots generate a bias at the substrates as high as 50 to 100 volts. The resulting lumen gain using such a coupling reaches 70–90%.

Figure 6:
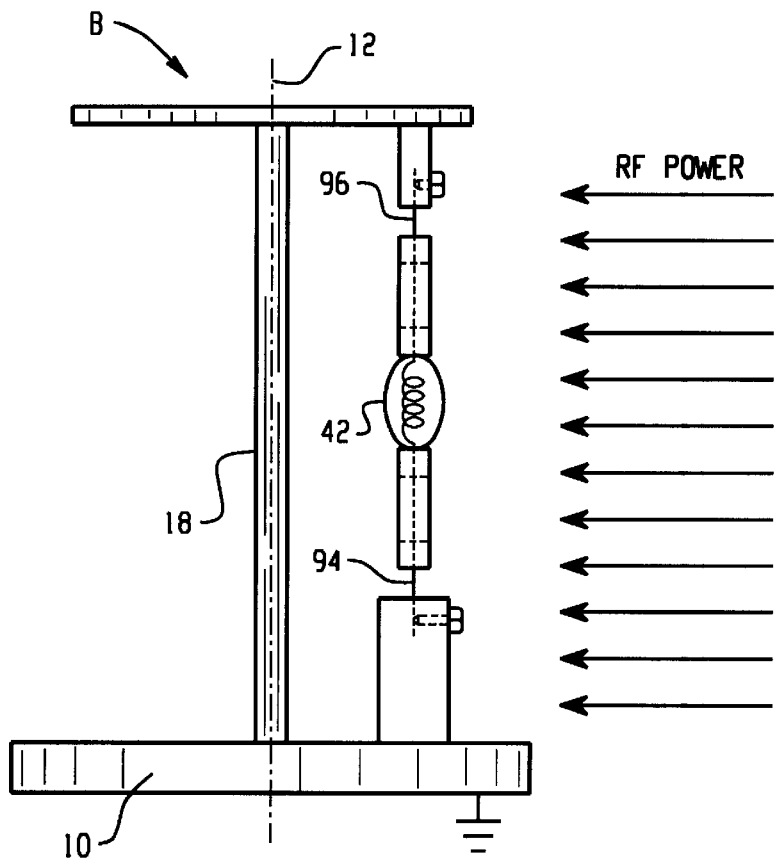
FIG. 6 is a front view of a substrate coupled to a radio frequency power source in accordance with another preferred embodiment of the present invention.

When the substrate coating is applied after the DEQ filament tubes are made, namely, the tungsten coil, two molybdenum foils, and two leads are assembled in the tube, these metal parts themselves can be used to couple the RF power, as shown in FIG. 6. Two lamp leads 94, 96 are exposed and connected to the primary rotation table 10 by, for example, two set screws. Similar to the cooper shots, the bias is about 50 to 100 volts.

Figure 7:
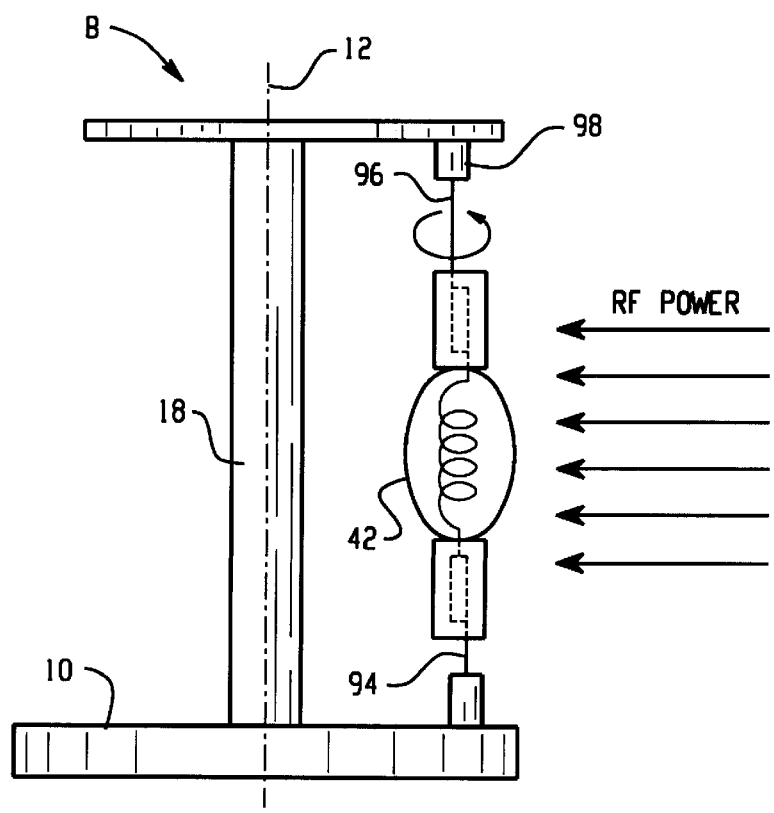
FIG. 7 is a front view of a substrate coupled to a radio frequency power source in accordance with another preferred embodiment of the present invention.

Alternatively, the substrates may be coupled to the RF power source in accordance with FIG. 7. A primary difference between the coupling in FIG. 6 and the coupling in FIG. 7 is that the DEQ upper lead in FIG. 7 is insulated from the primary table 10 via an insulator 98. As a result, there is a voltage drop across the coil which energizes the DEQ lamp.

As noted above, titanium (Ti) is commonly used as a target material to generate a titanium dioxide ($TiO_2$) film having a high refractive index. Therefore, $TiO_2$ is often selected as the high refractive optical interference film to be deposited on lamps. However, at about 800–900° C., a pure $TiO_2$ film changes from its amorphous phase to a crystal phase. The thin film expands and the outermost layer of the film becomes rougher than before. In addition, the layer interface deteriorates. Finally, the intrinsic stress and scatter loss of the film increases which may destroy the film and/or negatively effect its performance.

In one of the preferred embodiments of the present invention, Ti is doped with Tantalum (Ta) in order to minimize the foregoing problems. Preferably, 30% atomic percentage of Ta is added to the Ti. When oxygen is introduced into the chamber, the Ta reacts with the oxygen to form $Ta_2O_5$. $Ta_2O_5$ is advantageous for at least the following reasons:

1. The $Ta_2O_5$ has no chemical reaction with $TiO_2$;
2. $Ta_2O_5$ is a fairly high refractory oxide, having an index of about 2.0–2.2 which is comparable to the refractory index of $TiO_2$;
3. A 30% dope is allowed by the Ti/Ta phase diagram;
4. The Ta atom matches the argon ion bombardment in terms of sputtering yield;
5. $Ta_2O_5$ prevents $TiO_2$ phase transition at elevated lamp operating temperatures; and
6. The scatter loss and intrinsic stress in the $TiO_2/Ta_2O_5$ film have no increase.

Figure 8:
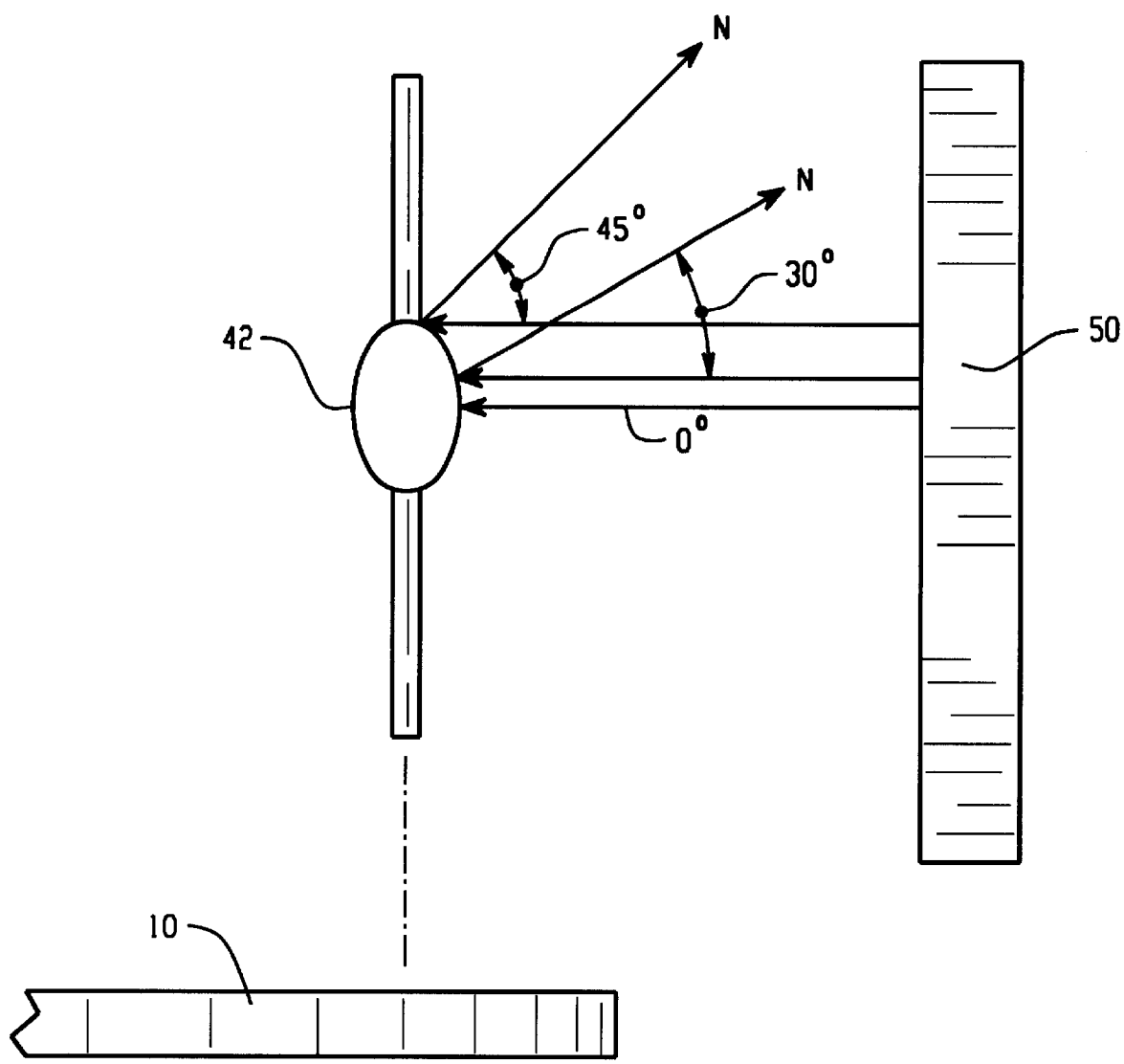
FIG. 8 is a front view of a vertically disposed substrate and an associated target.

When utilizing sputtering techniques, such as the magnetron sputtering process described herein, to coat light sources, the envelopes are typically loaded vertically within the chamber (see FIG. 8). Here, vertical loading means that the symmetric axis of the light source is perpendicular to the primary rotation table. Thus, the target atoms sputtered from the target 50 deposit on the lamp surface at different incident angles because the DEQ lamps have an elliptical shape. The resulting film across the elliptical lamp is non-uniform.

If every sputtering parameter is held constant for a DEQ lamp in a sputtering run, the deposition rate at the different locations of the lamp surface only depends on the incident angle of the incoming sputtered atoms. With reference to FIG. 8, the incident angle in the middle of the elliptical light source envelope 42 is 0°, while at the end of the elliptical light source the incident angle is about 45° (N denotes a line normal to the point of contact). The deposition rate approximately follows the cosine law. For example, if the rate in the middle of the light source is 100 angstroms per minute, then the rate at the end of the light source is 100 multiplied by a factor of cosine 45°, i.e. 70.7 angstroms per minute. Therefore, the thickness in the middle of the light source is always about 20–30% thicker than at the end. Such a nonuniform film on lamps can never fully realize the designed film performance.

Figure 9:
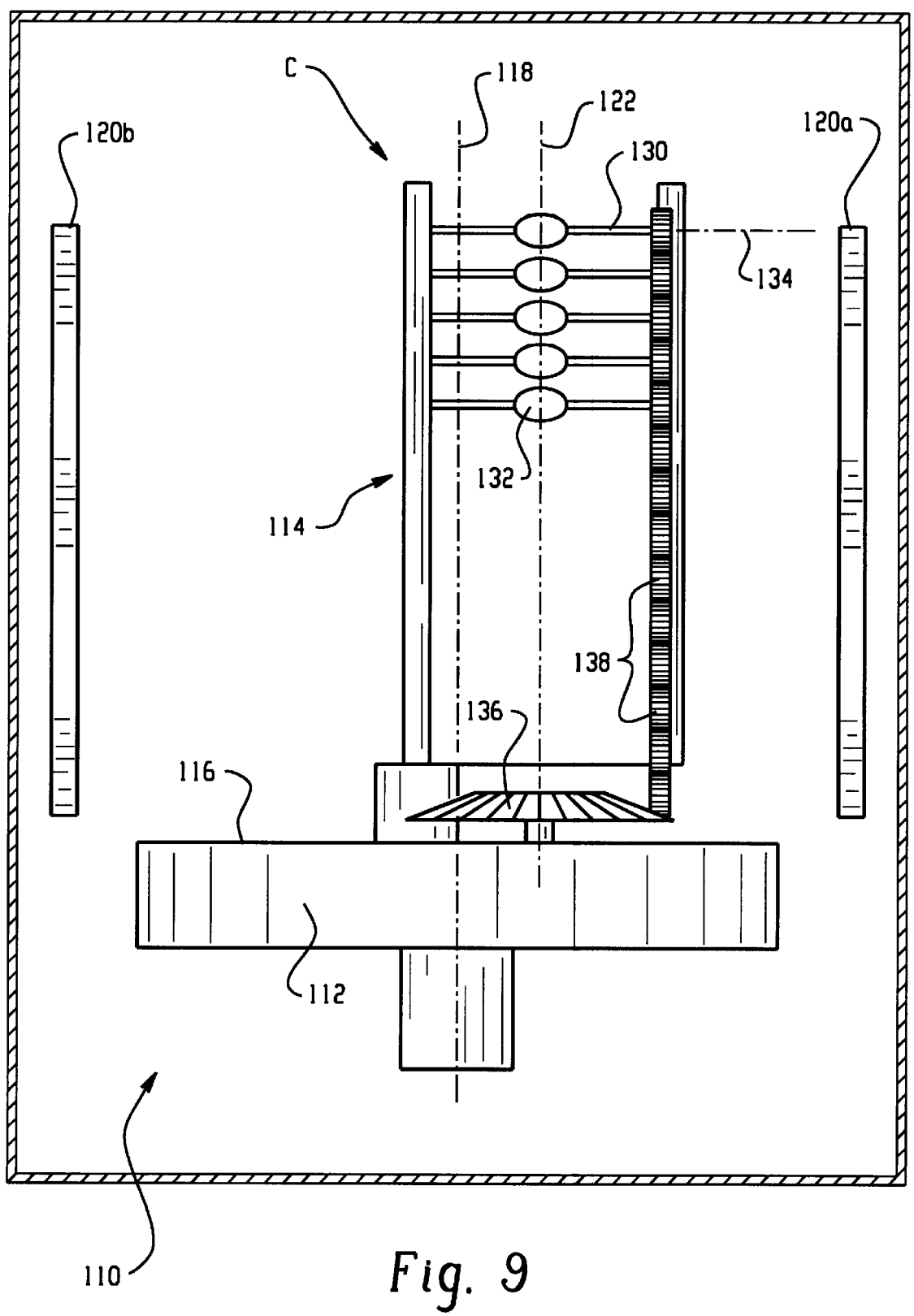
FIG. 9 is a front view of a horizontally loaded sputtering device in accordance with the present invention.
Figure 10:
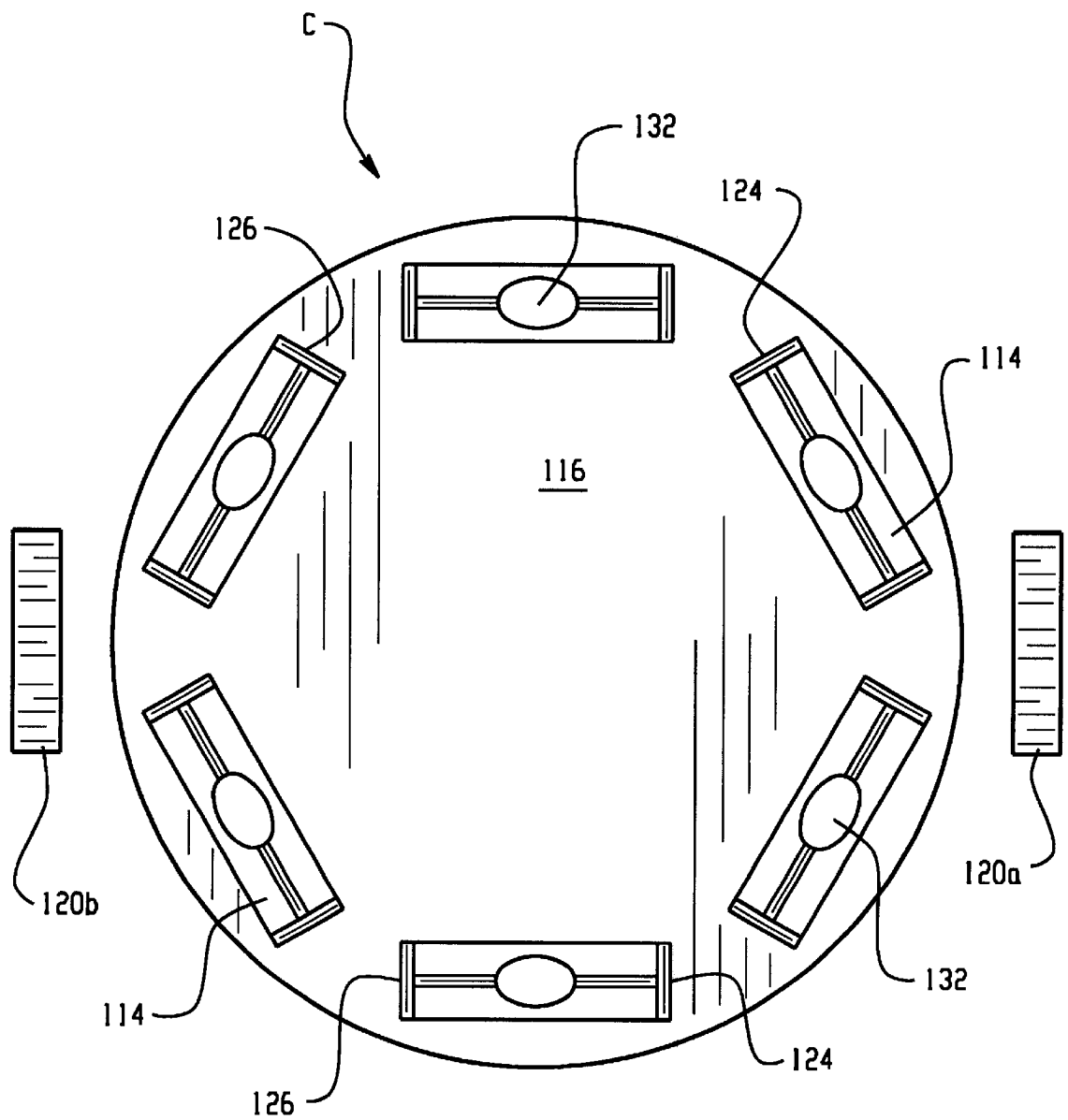
FIG. 10 is a top view of a horizontally loaded sputtering device in accordance with the present invention.
Figure 11:
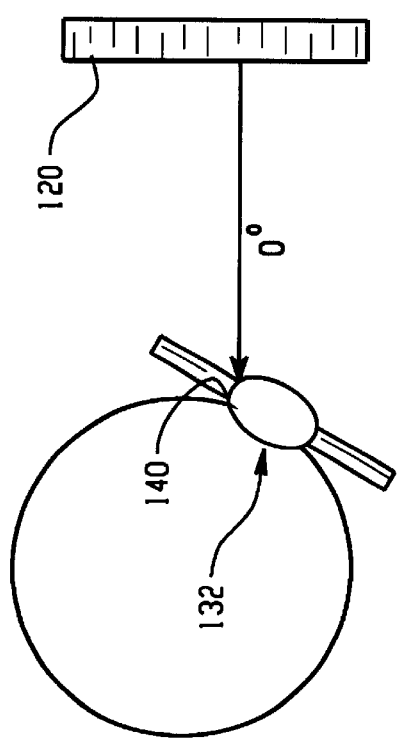
FIGS. 11–14 show the incident angle evolution of a lamp as it rotates past a target in accordance with the present invention.
Figure 12:
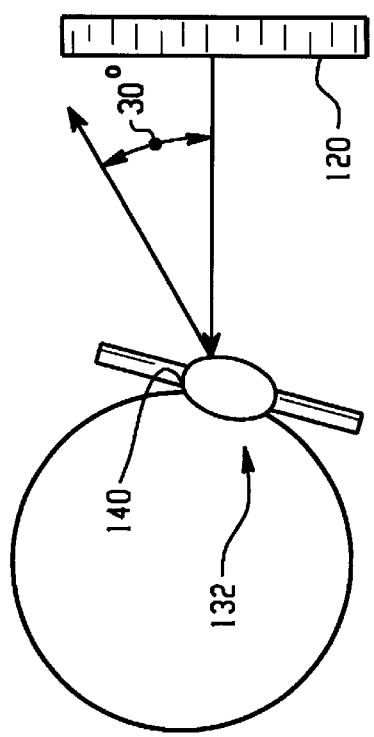
Figure 13:
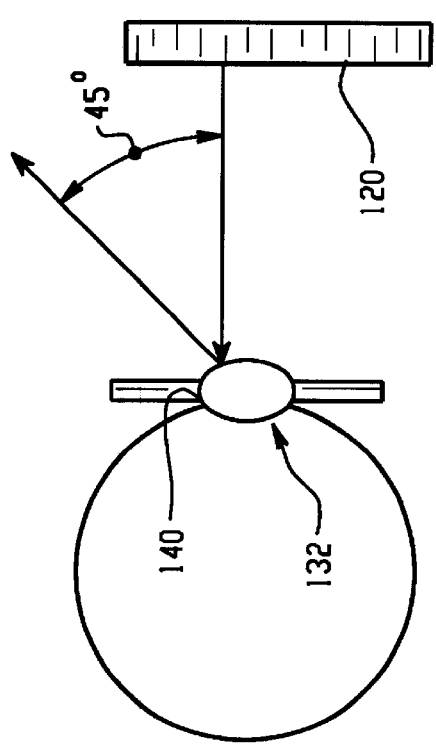
Figure 14:
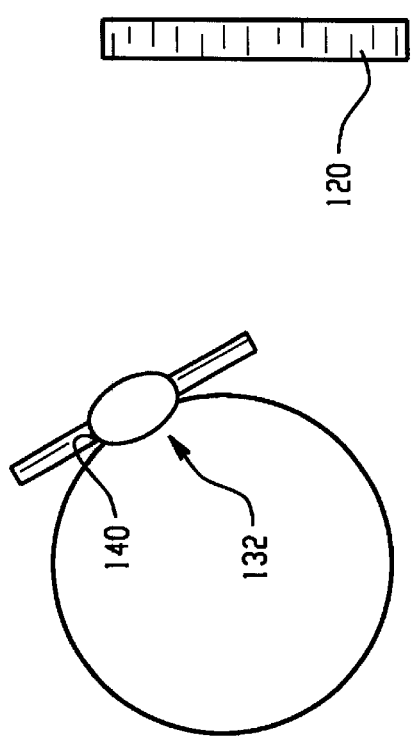

In order to overcome the problems associated with vertical loading of lamps during conventional sputtering techniques, the present invention provides a new rotation setting. With reference to FIGS. 9 and 10, a sputtering chamber 110 houses a substrate carrying assembly C which includes a primary rotation table 112 and at least one secondary table 114 mounted to a top surface 116 of the primary rotation table. The primary rotation table is substantially circular and is adapted to rotate about its central vertical axis 118. Also housed by the sputtering chamber are two targets 120a, 120b (referred to generally as 120) which are located on opposite sides of the chamber.

For ease of illustration, only one secondary table 114 is illustrated in FIG. 9. However, it will be understood that several secondary tables are preferably mounted to the top surface 116 of the primary rotation table as depicted in FIG. 10. The secondary tables are arranged concentrically around the periphery of the top surface of the primary rotation table. Unlike the first preferred embodiment, the secondary tables of this embodiment do not rotate about their central vertical axes 122. The only rotation they experience is when the primary rotation table rotates about axis 118.

Each secondary rotation table includes first and second parallel members 124, 126 spaced from one another and vertically disposed within the chamber. A plurality of substrate supports 130 extend horizontally between the first and second parallel members. At least one lamp 132 is horizontally loaded on each lamp support in such a manner that the symmetric axis of the lamp is parallel to the primary rotation table. The lamps are adapted to rotate about their central horizontal axis 134 (FIG. 9). A gear assembly 136 drives a group gear 138 which enables each lamp support to rotate the lamps carried thereon about axes 134.

In operation, the primary rotation table rotates each of the secondary tables about axis 118. At the same time, each of the lamps 132 rotate about axis 134 to ensure equal exposure of all substrate surfaces to the targets. FIGS. 11–14 illustrate the incident angle evolution of a lamp 132 passing the target 120 in a counterclockwise direction. Using a leading end 140 as a reference point, it is easy to follow how the incident angle changes as the primary rotation table rotates. For example, in FIG. 11, the incident angle for the leading end 140 is about 0°. It increases to about 30° in FIG. 12. It continues to increase to about 45° in FIG. 13 and in FIG. 14, the leading end is leaving the deposition zone.

As shown, the incident angle for any specific area on the lamp surface is no longer constant as is the case with vertical loading. Any spot on the elliptical surface of the lamp experiences a similar evolution. Hence, the deposition rate for the different locations on the lamp surface does not vary as much as in the case of vertical loading. As a result, a more uniform and denser film can be made over the entire elliptical surface of the lamp which enhances the optical film properties in terms of the refractive index (n) and the extinction coefficient (k). A lamp having an interference film applied using this type of horizontal loading will have a lumen gain of 80–90% compared to the 38% gain generally achieved using LPCVD.

The invention has been described with reference to the preferred embodiment. Obviously, modifications and alterations will occur to others upon a reading and understanding of this specification. The invention is intended to include all such modifications and alterations in so far as they come within the scope of the appended claims and the equivalents thereof.

What is claimed is:

1. A radio frequency (RF) magnetron sputtering device for lighting applications comprising:
    a magnetron sputtering chamber;
    first and second targets housed by the chamber and disposed on opposite sides of the chamber, the first target being made from a material with which a first film can be made and the second target being made from a material with which a second film can be made; and
    a substrate carrying assembly housed by the chamber, the substrate carrying assembly adapted to carry a series of substrates between a position adjacent the first target where the substrate is coated with the material having the first film and a position adjacent the second target where the substrate is coated with the material having the second film, said substrates individually rotated about a first axis, a second axis and a third axis.

2. A sputtering device according to claim 1, wherein the substrate carrying assembly includes a primary rotation table disposed in a first plane having a first surface and a second surface, the primary rotation table adapted to rotate about said first axis.

3. A sputtering device according to claim 2, wherein the substrate carrying assembly includes at least one secondary rotation table mounted to the first surface of the primary rotation table and extending from the primary rotation table, the secondary rotation table adapted to rotate about said second axis.

4. A sputtering device according to claim 3, wherein the secondary rotation table includes a series of substrate supports, each substrate support carrying a plurality of light sources which rotate about said third axis.

5. A sputtering device according to claim 4, wherein the light sources are double ended quartz lamps.

6. A sputtering device according to claim 3, wherein the substrate carrying assembly further includes:
   an elongated member extending from the top surface of the primary rotation table;
   at least one arm having a first end and a second end operatively connected at an intermediate portion to the elongated member; and
   a connecting member extending from a portion of the arm located adjacent the second end of the arm, the connecting member being operatively connected to the secondary rotation table.

7. A sputtering device according to claim 3, further comprising first and second radio frequency power sources coupled to the first and second targets respectively.

8. A sputtering device according to claim 7, further comprising a series of magnets located behind a rear surface of each of the first and second targets.

9. A sputtering device according to claim 8, further comprising first and second water channels in face to face relation with a surface of the first and second targets respectfully.

10. A sputtering device according to claim 1, further comprising a first and second radio frequency power source coupled to the first and second targets respectfully.

11. A sputtering device according to claim 10, wherein at least two gases are introduced into the chamber, the first and second radio frequency power sources generating a plurality of positively charged ions from one of the gases, the positively charged ions alternating between striking the first target and the second target thereby causing atoms to sputter off the targets and deposit on the surface of the substrates.

12. A sputtering device according to claim 10, wherein the first and second radio frequency power sources are coupled to a series of cooper shots operatively associated with each of the substrates.

13. A sputtering device according to claim 1, wherein the second target comprises a titanium material doped with a tantalum material.

14. A sputtering device according to claim 13, wherein the tantalum comprises 30% of an atomic percentage of the second target.

15. A sputtering device for lighting applications comprising:
   a sputtering chamber;
   first and second targets housed by the chamber and disposed on opposite sides of the chamber, the first target being made from a material with which a first film can be made and the second target being made from a material with which a second film can be made; and
   a substrate carrying assembly housed by the chamber, the substrate carrying assembly adapted to carry a series of substrates between a position adjacent the first target where the substrate is coated with the material having the first film and a position adjacent the second target where the substrate is coated with the material having the second film, the substrates being disposed within the sputtering chamber so that a symmetrical axis of each of the substrates lies in a plane and first and second radio frequency power sources are coupled to a series of cooper shots operatively associated with each of the substrates.

16. A sputtering device according to claim 15, wherein the sputtering device is a radio frequency magnetron sputtering device.

17. A sputtering device according to claim 15, wherein the substrate carrying assembly includes a primary rotation table disposed in a horizontal plane having a first upper surface and a second lower surface, the primary rotation table adapted to rotate about a first axis.

18. A sputtering device according to claim 17, wherein the substrate carrying assembly includes a series of secondary tables arranged concentrically around a periphery of the first upper surface of the primary rotation table.

19. A sputtering device according to claim 18, wherein the series of secondary tables include first and second parallel members vertically disposed within the sputtering chamber, the series of substrates being horizontally mounted between said first and second parallel members.

20. A sputtering device according to claim 18, wherein each of the series of substrates is operatively connected to the secondary table and each of the series of substrates rotates about a symmetrical axis during operation of the sputtering device.

21. A sputtering device according to claim 15, wherein the first film has a low refractive index and the second film has a high refractive index.

22. A sputtering device according to claim 15, wherein the second target comprises a titanium material doped with a tantalum material.

23. A method for applying an interference layer to light sources using a magnetron sputtering technique, the method comprising the steps of:
   providing first and second targets within a magnetron sputtering chamber on opposite sides of the sputtering chamber;
   providing a substrate carrying assembly within the sputtering chamber between the first and second targets;
   mounting a series of substrates to the substrate carrying assembly;
   rotating each individual substrate about a first axis, a second axis and a third axis; and
   selectively bombarding the first and second targets with a plurality of positively charged ions so that a plurality of atoms sputter off the first and second targets and deposit on a surface of the substrates.

24. The method according to claim 23, wherein the mounting step includes loading the substrates horizontally on to the substrate carrying assembly so that a symmetrical axis of the substrates lies in a horizontal plane.

25. The method according to claim 23, further comprising the steps of: operatively connecting a series of cooper shots to each substrate; and coupling the cooper shots to a radio frequency power source located within the sputtering chamber.

26. The method according to claim 23, wherein the step of providing first and second targets includes forming the second target from a titanium material doped with tantalum.

27. The method according to claim 23, wherein the step of providing the substrate carrying assembly within the sputtering chamber includes:
   rotatably mounting a primary rotation table within the sputtering chamber, the primary rotation table being adapted to rotate about said first axis; and mounting a secondary table to a top surface of the primary rotation table.

28. The method according to claim 27, wherein the step of mounting the series of substrates to the substrate carrying assembly includes operatively connecting the substrates to the secondary table.

29. The method according to claim 28, wherein the selectively bombarding step includes:

introducing first and second gases into the magnetron sputtering chamber;

applying radio frequency potentials to the first gas to generate the plurality of positively charged ions; and rotating the primary rotation table about the first axis so that the substrates are carried between a first position adjacent the first target and a second position adjacent the second target.

30. The method according to claim 29, further comprising the steps of:

rotating the secondary table about said second axis; and rotating each substrate about said third axis being along a symmetrical axis of each substrate.

* * * * *